United States Patent [19]

Kawakami et al.

[11] Patent Number: 5,250,757
[45] Date of Patent: Oct. 5, 1993

[54] PRINTED WIRING BOARD HAVING A CONNECTING TERMINAL

[75] Inventors: Shin Kawakami; Tatsuhiko Hayashida; Mitsuo Nakahara, all of Fujikubo, Japan

[73] Assignee: Nippon CMK Corp., Japan

[21] Appl. No.: 869,663

[22] Filed: Apr. 16, 1992

[30] Foreign Application Priority Data

Apr. 12, 1991 [JP] Japan .................. 3-348277

[51] Int. Cl.$^5$ .................................................. H05K 1/00
[52] U.S. Cl. ............................ 174/250; 29/831; 29/868
[58] Field of Search ............... 174/88 R, 250, 251, 174/253, 254, 255, 260, 261; 361/400, 401, 403, 404; 439/55, 67, 77; 29/831, 868, 878; 257/666

[56] References Cited

U.S. PATENT DOCUMENTS

| | | | |
|---|---|---|---|
| 4,795,079 | 1/1989 | Yamada | 174/88 R X |
| 4,950,527 | 8/1990 | Yamada | 174/250 X |
| 5,134,248 | 7/1992 | Kiec et al. | 439/77 X |
| 5,173,369 | 12/1992 | Kataoka | 257/666 X |

*Primary Examiner*—Leo P. Picard
*Assistant Examiner*—Trinidad Korka
*Attorney, Agent, or Firm*—Bruce L. Adams; Van C. Wilks

[57] ABSTRACT

A printed wiring board for forming an electric connection to an external device. The printed wiring board comprises a base material, and at least one connecting terminal formed on the base material for forming an electrical connection to an external device. A solder resist layer is formed on at least a portion of the base material surface excluding a connecting terminal forming region. A conductive protective layer is formed over the connecting terminal forming region and covers the connecting terminal. The end portion of the solder resist layer is separated from the end portion of the conductive protecting layer. An overcoat layer is formed on the separating portion for bridging the end portion of the solder resist layer and the end portion of the conductive protecting layer.

20 Claims, 2 Drawing Sheets

PRINTED WIRING BOARD HAVING A CONNECTING TERMINAL

BACKGROUND OF THE INVENTION

The present invention relates to printed wiring board capable of forming an electrical connection to an external device.

Conventionally, a printed wiring board is provided with a connecting terminal for forming an electrical connection to an external device, such as an other printed wiring board or other electronic equipment. The electric connection is realized by connecting a connecting terminal to another flexible printed wiring board by thermo-bonding or by inserting the connecting terminal to a connector of external devices.

FIGS. 6 and 7 show a conventional printed wiring board having such construction. An insulating base material 61 is provided having one surface with a predetermined circuit 62 formed by an operation such as screen printing exposure, etching or the like. Reference numeral 63 is a connecting terminal formed on the end portion of the base material simultaneously with the formation of the circuit 62. This connecting, terminal informing an electrical connection to the an external device. A terminal circuit 64 is also connected to the connecting terminal 63. A region including the circuit 62 of the base material 61 and the terminal circuit 64 is coated by a solder resist layer 65, thereby protecting them from oxidation. In this case, the solder resist layer 65 is not coated on a connection terminal forming region 66 for ejecting the electric connection to the external equipment.

In such a construction, the connecting terminal 63 may be subjected to insulation failure due to oxidization and an adhesion strength of thermo-bonding for the electric connection becomes insufficient. Thus, it is conventionally necessary to reinforce the connecting terminal 63. To this end, respective connecting terminals 63 are coated with a protecting layer 67. This protecting layer 67 is formed by printing conductive carbon ink on the base material 61. As shown in FIG. 7, a part of this protecting layer 67 is overlapped on the end portion of the previously applied solder resist layer 65.

As circuits becoming more dense, the distance between the connecting terminals 63 formed on the base material 61 becomes more narrow. In the conventional printed wiring board, a short-circuit results between the connecting terminals 63 and insulation becomes deteriorated. In other words, a copper foil, such as the connecting terminal provided on the base material 61, has a thickness of about 35 μm, and solder resist layer 65 has a thickness of 14~17 μm, so that stepped level differences of 49~52 μm are caused on the surface of the base material 61, and thus the protecting layer 67 must be printed on such a stepped level differences. On printing the protecting layer on the stepped level differences, as shown in FIG. 8, a blur 68 of the protecting layer 67 occurs at the overlapped portion of the protecting layer 67 and the solder resist layer 65. When such a blur 68 occurs on the high densified connecting terminal 63, a bridged connecting is generated between adjacent connection terminals 63, so that the connecting terminals 63 are short-circuited to each other and the insulating property between the connecting terminals 63 becomes inferior.

SUMMARY OF THE INVENTION

It is an object of the present invention to overcome the above described defects of the conventional printed wiring board.

It is another object of the present invention to provide a printed wiring board in which even in circuits of high density a short circuiting between the connecting terminals and a reduction in the insulating property between elements of the circuit pattern do not occur.

According to the present invention, there is provided a printed wiring board comprising a base material. A connecting terminal is formed on the base material for effecting an electrical connection to an external device a solder resist layer is provided a including a terminal circuit connected to the connecting terminal formed on the base material in such a manner that a region excluding the connecting terminal forming region is covered. A conductive protective layer is provided for covering the connecting terminal. The end portion of the solder resist layer is separated from the end portion of the conductive protecting layer, and an overcoat layer is formed on the separating portion and for bridging the end portion of the solder resist layer and the end portion of the conductive protective layer.

In the above construction, the solder resist layer is separated from the protecting layer for covering the connecting terminals, so that the covering of the protecting layer is performed on only the thickness portion of the connecting terminals. Therefore, the conventionally experienced blur of the protecting layer does not occur at the covering thereof, so that short-circuiting between the connecting terminals and inferior insulating property can be prevented. Moreover, the overcoat layer coats the exposed portion i the connecting terminal which is not coated by the protecting layer, so that the oxidization of the exposed portion of the connecting terminal can be prevented.

BRIEF DESCRIPTION OF THE DRAWINGS

This and other aspects of the printed wiring board according to the present invention will be explained in more detail with reference to the drawings, in which.

DETAILED EXPLANATION OF THE PREFERRED EMBODIMENT

Referring now in particular to the drawings, there is shown a printed wiring board according to the present invention.

Figure 1:
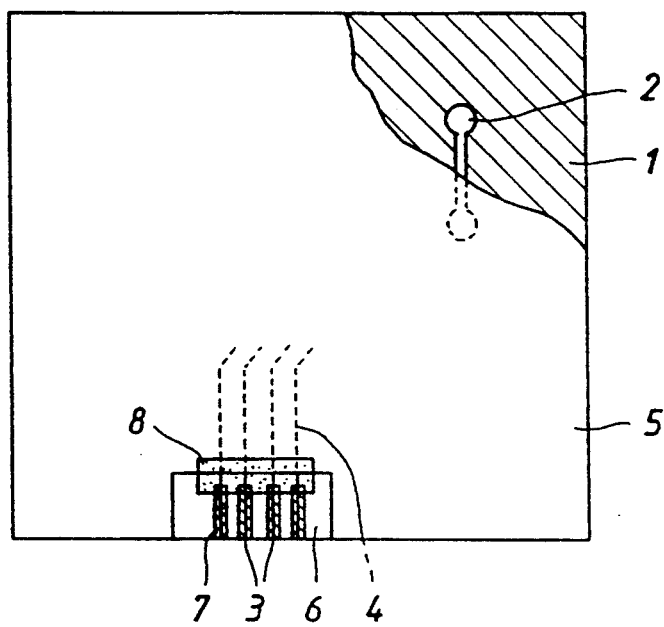
FIG. 1 is a plan view showing an embodiment of a printed wiring board according to the present Invention.
Figure 2:
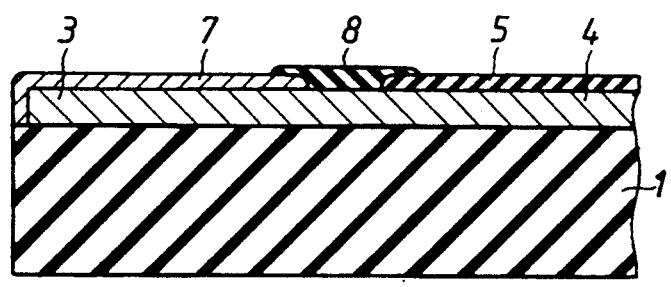
FIG. 2 is a cross-sectional view of the printed wiring board shown in FIG. 1.

FIGS. 1 and 2 show one embodiment of a printed wiring board according to the present invention.

An insulating base material 1 is provided with a predetermined circuit 2, connecting terminals 3 for performing an electric connection to an external device and terminal circuits 4 which are arranged to lead to the connecting terminals 3. This circuit 2, the connecting terminals 3 and the terminal circuits 4 are simultaneously formed by a usual circuit forming process in such a manner that a copper clad laminate is subjected to a printing treatment, an exposure treatment, an etching treatment or the like. After this circuit formation, the base material 1 is covered an insulating solder resist layer 5, to thereby protect the base material. This solder resist layer 5 is applied on at least a portion of the base material 1 excluding region 6 which forms the connecting terminal 3. On the contrary, the connecting terminal forming region 6 is provided with protecting layers 7. These protecting layers 7 are formed by applying conductive carbon ink or the like, thereby coating respective connecting terminals 3. In this case, the inner end portions of the protecting layers 7 are separated from the end portion of the solder resist layer 5, as described later and this separating portion is coated with an overcoat layer 8.

Figure 3:
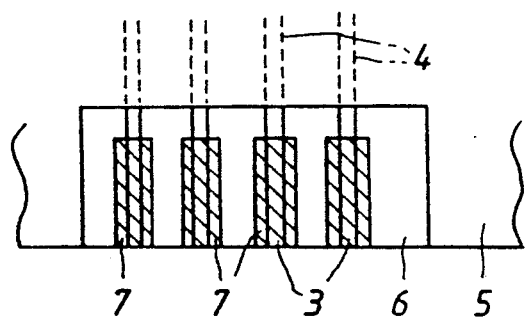
FIG. 3 is a plan view showing a manufacturing step of the printed wiring board according to the present invention.
Figure 4:
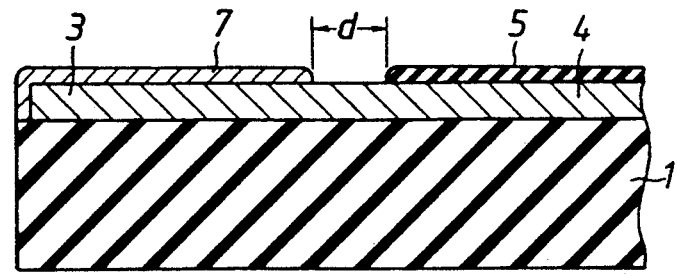
FIG. 4 is a cross-sectional view of the printed wiring board shown in FIG. 3.

A method of manufacturing the above constructed printed wiring board according to the present invention is explained with reference to FIGS. 2 through 5, in which FIG. 4 shows a sectional view corresponding to FIG. 3, and FIG. 2 shows a sectional view corresponding to FIG. 5. FIGS. 3 and 4 show the condition that the solder resist layer 5 is formed on the region of the base material 1 including the region 6 for forming the connecting terminals 3 and the protecting layers 7 are coated on the connecting terminals after formation of the solder resist layer 5. These protecting layers 7 are formed by printing conductive carbon ink on the base material 1 thereby coating respective connecting terminals 3 with the respective protecting layers 7. In case of forming the protecting layers 7 the inner end portions of the protecting layers 7, and the end portion of the solder resist layer 5 are separated from each other with a given distance d (for example, d=0.5 mm), so that the protecting layer 7 is not overlapped on the solder resist layer 5. The protecting layers 7 are, therefore, provided on the thickness portion of only the connecting terminals 3, resulting in a small stepped level difference, so that blur does not occur during the printing. Therefore, even in the case of a high densified connecting terminal, the protecting layers 7 of adjacent connecting terminals 3 do not bridge together and thus short-circuits between connecting terminals and an inferior insulating property do not occur.

Figure 5:
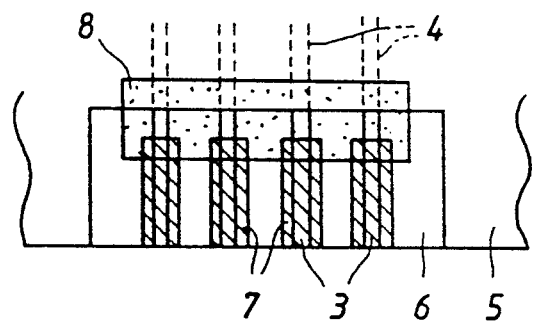
FIG. 5 is a plan view of the printed wiring board shown in FIG. 2.
Figure 6:
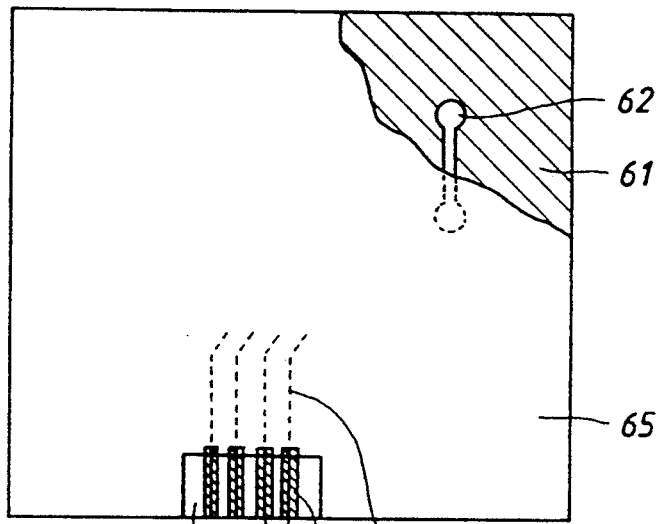
FIG. 6 is a plan view showing the conventional printed wiring board.
Figure 7:
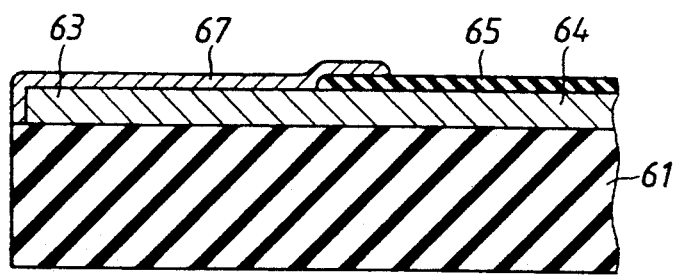
FIG. 7 is a partially sectional view shown in FIG. 6.
Figure 8:
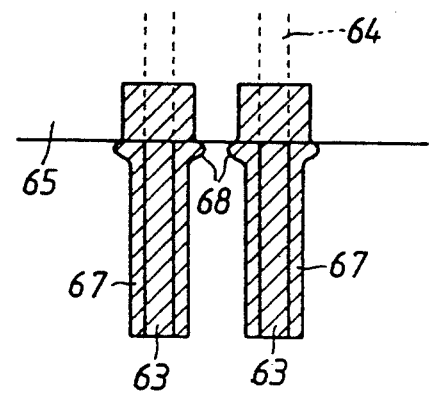
FIG. 8 is a plan view showing a blur of a protecting layer.

In this way, after formation of the protecting layers 7, as shown in FIGS. 2 and 5, the overcoat layer 8 is formed. This overcoat layer 8 is realized by applying an insulating ink on the base material 1 so as to coat the separating portion between the protecting layer 7 and the solder resist layer 5, thereby bridging the end portion of the protecting layer 7 and the end portion of the solder resist layer 5 with the overcoat layer 8.

This overcoat layer 8, coats the exposed portion of the connecting terminal which is not coated with the protecting layer 7. Thus this exposed portion can be protected from oxidizing. This overcoat layer 8 can be formed by printing a display character or the like of the printed wiring board, at the same time by printing ink for its symbol mark thereby being capable of omitting the step of forming the overcoat layer 8.

What is claimed is:

1. A printed wiring board, comprising: a base material, a connecting terminal formed on the base material for effecting an electrical connection to an external device, a solder resist layer formed on the base material excluding a connecting terminal forming region thereof, a conductive protecting layer formed on a portion of the connecting terminal forming region and covering the connecting terminal so that the end portion of the solder resist layer is separated from the end portion of the conductive protecting layer and a portion of the connecting terminal between the solder resist layer and the conductive protecting layer is left exposed, and an insulating overcoat layer formed on the separating portion for bridging the end portion of the solder resist layer and the end portion of the conductive protecting layer to insulate and protect the exposed portion of the connecting terminal.

2. A printed wiring board, comprising: a base material having a surface; at least one connecting terminal formed on the surface for electrical connection with an external device; a solder resist layer formed over at least a portion of the surface excluding a connecting terminal forming region which surrounds at least a portion of the connecting terminal; a conductive protection layer formed over at least a portion of the connecting terminal, the conductive protection layer being spaced from the solder resist layer to define therebetween a separating gap portion and being formed so that a portion of the connecting terminal between the solder resist layer and the conductive protecting layer is left exposed; and an insulative overcoat layer formed on the separating gap portion effective to insulate and protect the exposed portion of the connecting terminal.

3. A printed wiring board according to claim 2; further comprising a printed circuit formed on the base material and electrically connected with the connecting terminal.

4. A printed wiring board according to claim 2; wherein the at least one connecting terminal comprises a plurality of connecting terminals; and the conductive protection layer comprises at least one layer of conductive carbon ink formed on each connecting terminal.

5. A printed wiring board according to claim 4; wherein each conductive carbon ink layer comprises a silk screen-printed ink layer.

6. A printed wiring board according to claim 4; wherein the insulative overcoat layer comprise an insulative ink.

7. A printed wiring board according to claim 4; wherein the separating gap portion has a width on the order of 0.5 mm.

8. A printed wiring board according to claim 4; wherein the insulative overcoat layer comprises an insulative ink printed to form a display character.

9. A printed wiring board according to claim 4; wherein the insulative overcoat layer covers the separating gap portion and overlaps a portion of the conductive protection layer and the solder resist layer.

10. A printed wiring board according to claim 2; wherein the insulative overcoat layer comprises an insulative ink.

11. A printed wiring board according to claim 1; wherein the separating a portion has a width on the order of 0.5 mm.

12. A printed wiring board according to claim 2; wherein the insulative overcoat layer comprises an insulative ink printed to form a display character.

13. A printed wiring board according to claim 2; wherein the insulative overcoat layer covers the separating gap portion and overlaps a portion of the conductive protection layer and the solder resist layer.

14. A method of manufacturing a printed wiring board, comprising the steps of providing a base material having a surface; forming at least one connecting terminal on the surface for electrical connection with an external device; forming a solder resist layer over at least a portion of the surface excluding a connecting terminal region which surrounds at least a portion of the connecting terminal; forming a conductive protection layer over at least a portion of the connecting terminal so as to define a separating gap portion between the conductive protection layer and the solder resist layer and so that a portion of the connecting terminal between the solder resist layer and the conductive protecting layer is left exposed; and forming an insulating overcoat layer on the separating gap portion effective to insulate and protect the exposed portion of the connecting terminal.

15. A method of manufacturing a printed wiring board according to claim 14; further comprising the step of forming a printed circuit on the base material when forming the at least one connecting terminal.

16. A method of manufacturing a printed wiring board according to claim 14; wherein the at least one connecting terminal comprises a plurality of connecting terminals; and the conductive protection layer is formed by silk screening at least one layer of conductive carbon ink on each connecting terminal.

17. A method of manufacturing a printed wiring board according to claim 14; wherein the insulative overcoat layer is formed by printing an insulative ink.

18. A method of manufacturing a printed wiring board according to claim 14; wherein the separating gap has a width on the order of 0.5 mm.

19. A method of manufacturing a printed wiring board according to claim 14; wherein the insulative overcoat layer is formed by printing a display character.

20. A method of manufacturing a printed wiring board according to claim 14; wherein the insulative overcoat layer covers the separating gap portion and overlaps a portion of the conductive protection layer and the solder resist layer.

* * * * *